United States Patent

Kyusho et al.

[11] Patent Number: 5,859,868
[45] Date of Patent: Jan. 12, 1999

[54] SOLID-STATE LASER DEVICE WHICH IS PUMPED BY LIGHT OUTPUT FROM LASER DIODE

[75] Inventors: Yukio Kyusho; Motohiro Arai, both of Tokyo, Japan

[73] Assignee: Nec Corporation, Tokyo, Japan

[21] Appl. No.: 788,915

[22] Filed: Jan. 22, 1997

[30] Foreign Application Priority Data

Jan. 22, 1996 [JP] Japan .................................. 8-008453

[51] Int. Cl.$^6$ .................................................. H01S 3/091
[52] U.S. Cl. ............................................. 372/75; 372/71
[58] Field of Search ........................... 372/69–72, 75

[56] References Cited

U.S. PATENT DOCUMENTS

| 4,553,238 | 11/1985 | Shaw et al. .......................... 372/70 X |
| 4,763,975 | 8/1988 | Scifres et al. ............................ 385/33 |
| 5,022,043 | 6/1991 | Jacobs .................................. 372/75 X |
| 5,323,414 | 6/1994 | Baird et al. ................................ 372/75 |
| 5,572,541 | 11/1996 | Suni ........................................ 372/70 |
| 5,689,522 | 11/1997 | Beach ...................................... 372/75 |

FOREIGN PATENT DOCUMENTS

| 50-143491 | 11/1975 | Japan . |
| 1-251678 | 10/1989 | Japan . |
| 2-146782 | 6/1990 | Japan . |
| 2-185082 | 7/1990 | Japan . |
| 3-44982 | 2/1991 | Japan . |
| 4-48664 | 2/1992 | Japan . |
| 4-320383 | 11/1992 | Japan . |
| 5-63269 | 3/1993 | Japan . |
| 6-347609 | 12/1994 | Japan . |
| 7-98402 | 4/1995 | Japan . |
| 7-507901 | 8/1995 | Japan . |

OTHER PUBLICATIONS

Kaneda et al., "7.6 W of continuous–wave radiation in a TEM$_{00}$ mode from a laser–diode end–pumped Nd:YAG Laser", Optics Letters, vol. 17, No. 14, Jul. 15, 1992, pp. 1003–1004.

D.C. Shannon et al., "High–power Nd:YAG laser end pumped by a cw, 10 mm × 1 $\mu$m aperture, 10–W laser–diode bar", Optics Letters, vol. 16, No. 5, Mar. 1, 1991, p. 313.

Primary Examiner—John D. Lee
Attorney, Agent, or Firm—Sughrue, Mion, Zinn, Macpeak & Seas, PLLC

[57] ABSTRACT

The diameter of the spot of the light output from a laser diode is reduced through a coupled optical system so as to be smaller than the incidence aperture of a tapered total reflection rod. The light output from the coupling optics is focused into the incidence aperture of the total reflection rod. The total reflection rod is equipped with a smaller emission aperture than the diameter of the incidence aperture and further reduces the spot of the focused light. That is, the light passing through the total reflection rod is reduced to a smaller diameter while being totally reflected internally. A laser medium is in optical contact with the emission aperture of the total reflection rod and is pumped by the light which is output from the total reflection rod.

16 Claims, 10 Drawing Sheets

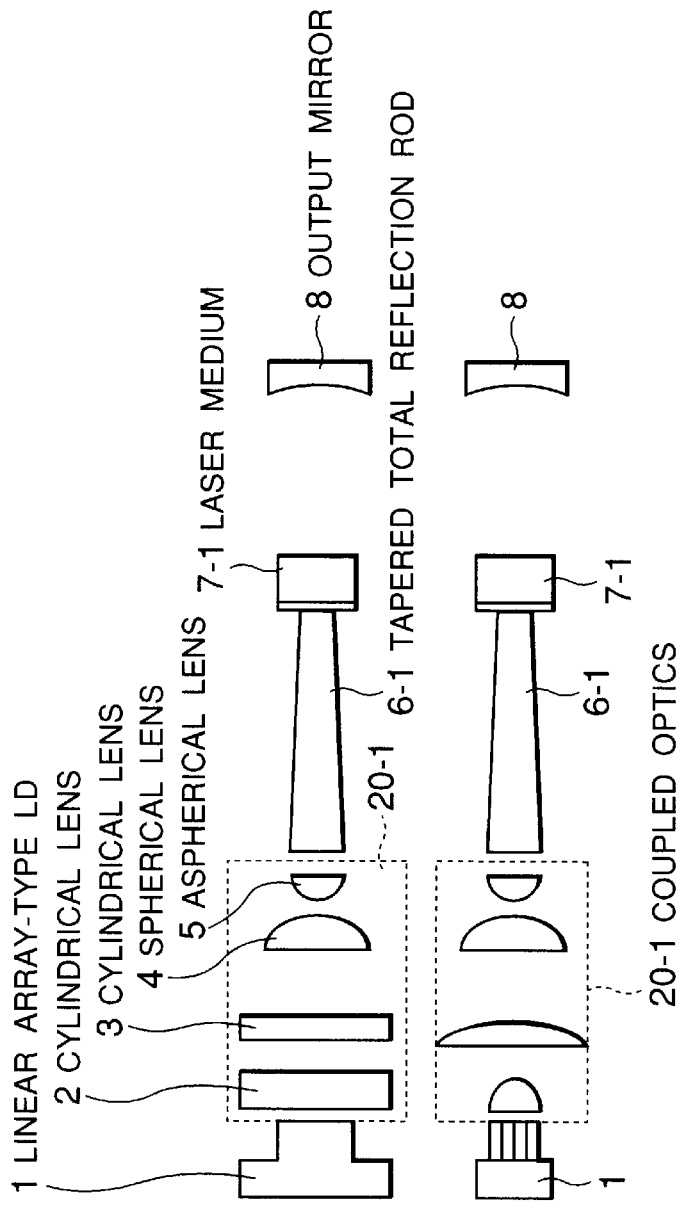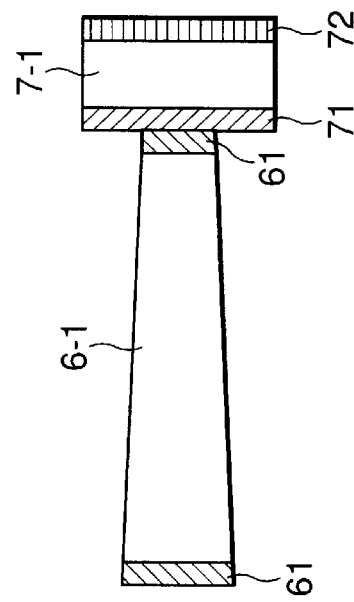

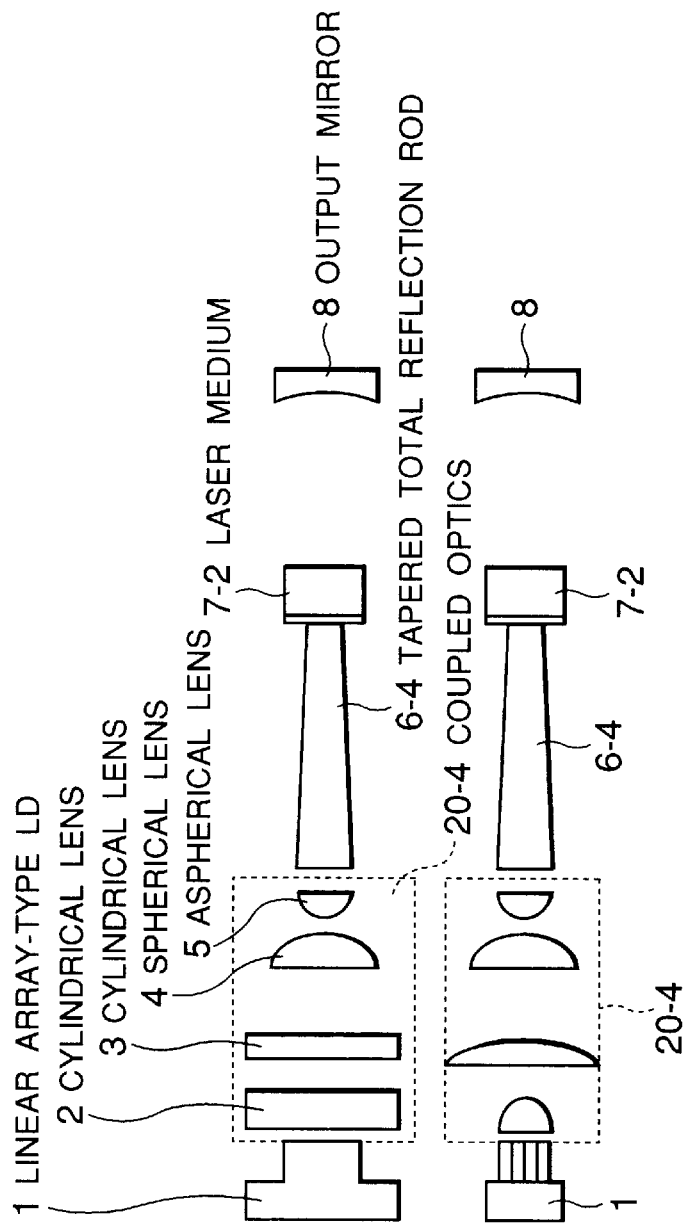
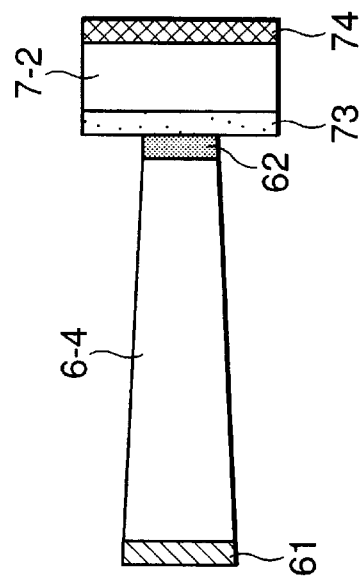
FIG.4A
FIG.4B
FIG.4C

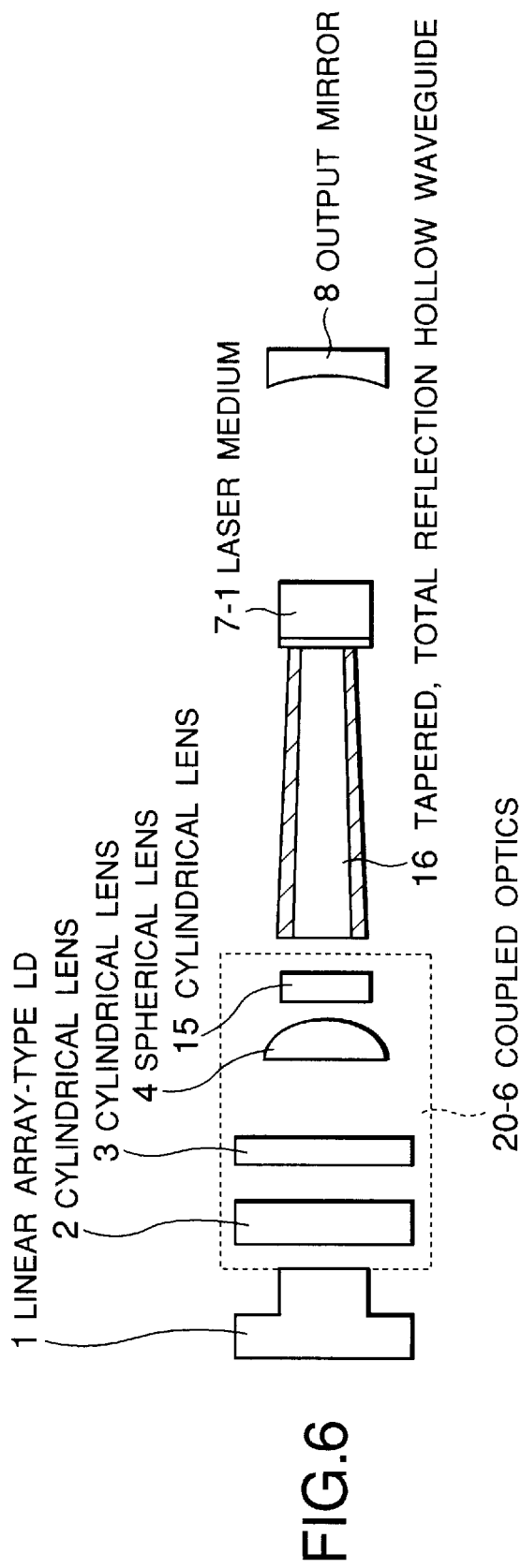

SOLID-STATE LASER DEVICE WHICH IS PUMPED BY LIGHT OUTPUT FROM LASER DIODE

BACKGROUND OF THE INVENTION

1. Field of the Invention

The present invention relates to a solid-state laser device which is pumped by light output from a laser diode (hereunder abbreviated to "LD" and "LD-pumped solid-state laser device", respectively), and more particularly to an end pumping system-based LD-pumped solid-state laser device capable of inducing high-power optical output in a $TEM_{00}$ mode in which specific TEM waves which are electromagnetic waves propagate through wave guides or cavities).

2. Description of the Related Art

With conventional LD-pumped solid-state laser devices, in order to produce $TEM_{00}$-mode laser light with high efficiency, the end pumping system is often used which provides a higher efficiency of overlap between the light from an LD for pumping a laser crystal (hereunder abbreviated to "LD-light") and the laser beam oscillating in a resonator than the side pumping system. With end pumping system-based LD-pumped solid-state laser devices, it is necessary to efficiently reduce the diameter of the beams of the LD-pumping light which are output from the stripe section of the LD with a variety of large divergence angles so as to match the diameter of the $TEM_{00}$-mode laser light in the resonator.

As disclosed in Japanese Unexamined Patent Application Disclosure HEI 6-347609, LD-pumped light is usually focused through a condenser lens such as a gradient-index lens (hereunder abbreviated to "GRIN lens") or focused through a single convex lens as the condenser lens. In addition, in cases where the LD-pumped light must be focused to a small cross section, an optical lens system provided by combining a plurality of convex lenses and/or concave lenses is used to focus the LD-pumped light.

Here, this type of conventional LD-pumped solid-state laser devices is also disclosed in, for example, "High-power Nd:YAG laser end pumped by a cw, 10 mm×1 μm aperture, 10-W laser-diode bar" in *OPTICAL LETTERS*, 16, No. 5, Mar. 1, 1991; and "7.6 W of continuous-wave radiation in a $TEM_{00}$ mode from a laser-diode end-pumped Nd:YAG laser" in *OPTICAL LETTERS*, 17, No. 14, Jul. 15, 1992, in addition to the document mentioned above.

The conventional LD-pumped solid-state laser device disclosed in the former document uses a plurality of cylindrical lenses or rod lenses to focus LD-pumped light. In contrast, the conventional LD-pumped solid-state laser device disclosed in the latter document uses a bundle of fibers to focus LD-pumped light.

When such conventional LD-pumped solid-state laser devices are applied to single stripe-type LDs, the optical diameter of the LD-light may be reduced to approximately 100–200 μm, though the focused spot thereof is elliptical. In order to increase the output from single stripe-type LDs, however, they must be configured so as to focus outputs from a plurality of LD light sources coupled with respective optical fibers through a lens, as disclosed in Japanese Unexamined Patent Application Disclosure HEI 4-320383, or a bundle of fibers connected to output sections of a plurality of LD light sources must be used, as disclosed in Japanese Unexamined Patent Application Disclosure HEI 1-251678, in either case of which the overall coupled optical system inevitably becomes complicated and larger.

Japanese Unexamined Patent Application Disclosure HEI 2-146782 also discloses another conventional LD-pumped solid-state laser device which uses a focusing optical system equipped with a fiber-coupled-type pumping optical system which focuses LD-pumping light output through a core of approximately 100 μm in diameter at a ratio of 1:1 or less. In particular, the incidence section of the optical fiber may take in pumped light even with a relatively large beam spot by using an optical fiber equipped with a tapered member.

With this conventional LD-pumped solid-state laser device, however, since the LD-pumping light emitted through the emission end of the optical fiber diverges at a large angle, the focusing optical system placed downward from the emission end of the optical fiber must have a microscopic objective lens-level numerical aperture (NA) in order to minimize the coupling loss. Particularly, a complicated and large optical system is needed in order to reduce the diameter of the pumped light so as to roughly match the core diameter of the fiber at the emission end. This also results in a lower transmittance of the pumped light and a higher manufacturing cost.

In addition, although generally it is extremely difficult to apply anti-reflective coats to both ends of flexible optical fibers, the output of the LD-pumped light is inevitably lost when no anti-reflective coats are applied to both ends of the optical fiber. For example, when an optical fiber formed of quartz is used, the LD-pumped light is lost by approximately 8% at both ends thereof.

In addition, in the case of the conventional LD-pumped solid-state laser device, dust tends to deposit at the output end of the optical fiber, and thus the output end of the optical fiber tends to be damaged.

SUMMARY OF THE INVENTION

It is an object of the present invention to provide an end pumping system-based LD-pumped solid-state laser device capable of focusing pumped light emitted from a laser diode into a laser medium in a high density.

It is another object of the present invention to provide an end pumping system-based LD-pumped solid-state laser device capable of efficiently launching the pumped light output from a laser diode into a laser medium.

It is yet another object of the present invention to provide an end pumping system-based, simply configured, small LD-pumped solid-state laser device capable of focusing the pumped light output from a laser diode into a laser medium in a high density and with a high transmission efficiency.

In order to accomplish the objects mentioned above, the laser device having means for pumping a laser medium with light which is output from a laser diode according to the present invention comprises an optical medium to which light output from a laser diode is input and has a smaller emission aperture than an incidence aperture and a laser medium which is placed in contact with the emission aperture of said optical medium and is pumped by light which is output from said optical medium.

BRIEF DESCRIPTION OF THE DRAWINGS

The above and other objects, features and advantages of the present invention will become more apparent from the following detailed description taken with the accompanying drawings in which:

FIG. 1A is a side view illustrative of the configuration of the LD-pumped solid-state laser device according to a first embodiment of the present invention;

FIG. 1B is a plan view illustrative of the configuration of the LD-pumped solid-state laser device according to the first embodiment of the present invention;

FIG. 1C is an illustration of the configuration of the main portion of the LD-pumped solid-state laser device according to the first embodiment of the present invention;

FIG. 4A is a side view illustrative of the configuration of the LD-pumped solid-state laser device according to a fourth embodiment of the present invention;

FIG. 4B is a plan view illustrative of the configuration of the LD-pumped solid-state laser device according to the fourth embodiment of the present invention;

FIG. 4C is an illustration of the configuration of the main portion of the LD-pumped solid-state laser device according to the fourth embodiment of the present invention;

FIG. 6 is a side view illustrative of the configuration of the LD-pumped solid-state laser device according to a sixth embodiment of the present invention;

DETAILED DESCRIPTION

Figures 2A, 2B:
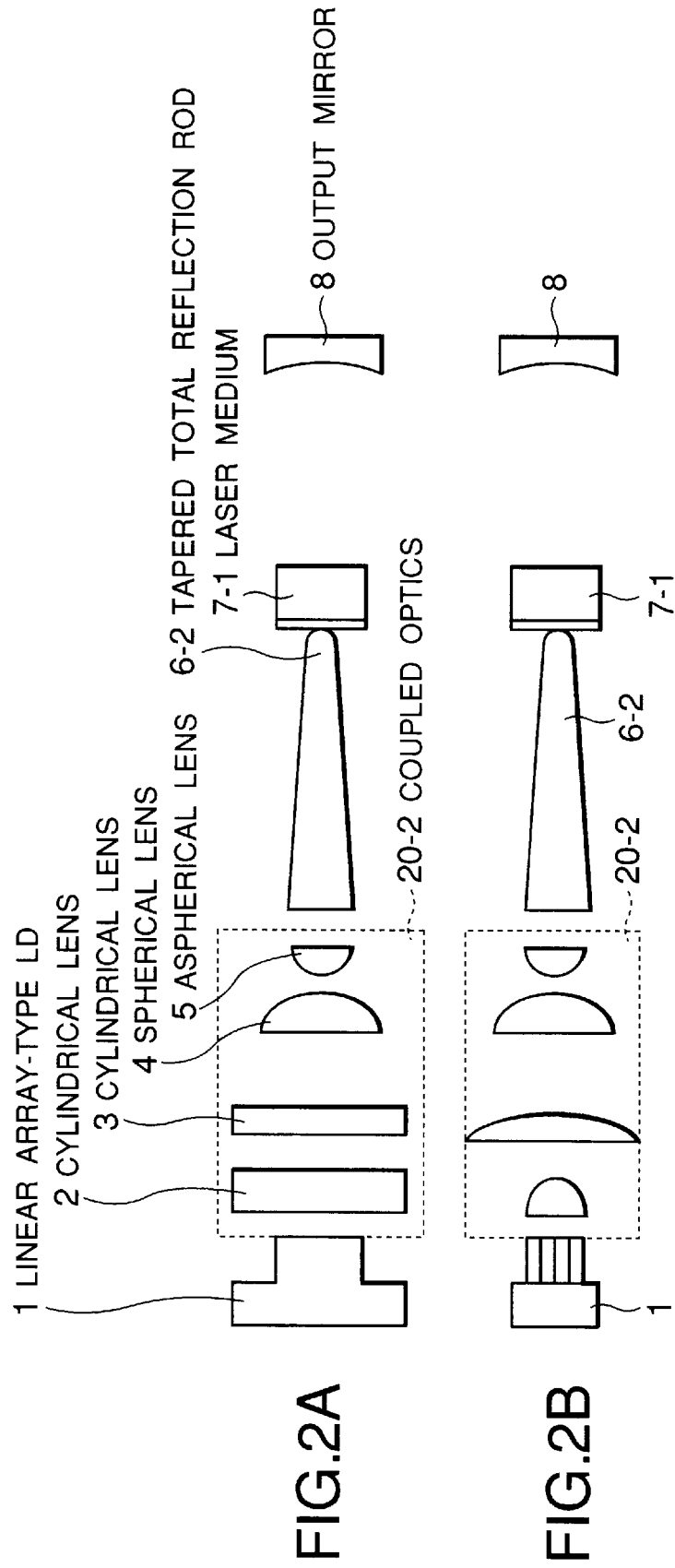
FIG. 2A is a side view illustrative of the configuration of the LD-pumped solid-state laser device according to a second embodiment of the present invention.
FIG. 2B is a plan view illustrative of the configuration of the LD-pumped solid-state laser device according to the second embodiment of the present invention.

The LD-pumped solid-state laser device according to the first embodiment of the present invention will now be described with reference to FIGS. 1A, 1B and 1C.

Referring to FIGS. 1A and 1B, beams of LD-pumping light emitted from the respective stripe sections of a linear array-type LD 1, spreading with a large divergence angle of approximately 40° in the direction perpendicular to the length of the stripes, are collimated only in that direction through cylindrical lenses 2 and 3. The collimated beams of LD-pumped light are then focused with a reduction ratio on the order of 1/5 to 1/10 through a focusing optical system comprising a spherical lens 4 and an aspherical lens 5, and the beams are focused to a diameter on the order of 2–3 mm immediately after the aspherical lens 5. Here, the transmission efficiency of the LD-light is approximately 90%. The LD-pumped light with a reduced diameter which has been emitted through a coupled optical system 20-1 equipped with the cylindrical lenses 2 and 3, the spherical lens 4 and the aspherical lens 5 are launched into a tapered total reflection rod 6-1.

The side of the tapered total reflection rod 6-1, which is opposed to the coupling optics 20-1, is located at such place as to minimize the diameter of the LD-light which is output from the coupling optics 20-1. The total reflection rod 6-1 is tapered in such a manner that the LD-pumped light incidence surface (hereunder referred to as the incidence surface) has a larger diameter than the LD-pumped light emission surface (hereunder referred to as the emission surface); for example, the incidence surface is formed with a diameter of approximately 2 mm, and the emission surface is formed with a diameter of approximately 0.5 mm. Here, the coupling optics 20-1 reduces the diameter of the LD-light so as to be smaller than the size of the incidence surface of the total reflection rod 6-1. The total reflection rod 6-1 further reduces the diameter of the incident LD-light while totally reflecting it internally. In addition, the length of the total reflection rod 6-1 is preferred to be on the order of 20–100 mm. Although the total reflection rod 6-1 is preferred to be shorter in order to downsize the entire laser device, the mode scrambling effect is reduced when it is excessively short.

The total reflection rod 6-1 is composed like an optical fiber having a core and cladding. However, the total reflection rod 6-1 may be made of an inflexible optical member, without being limited to an ordinary flexible optical fiber. More specifically, the total reflection rod 6-1 may be designed as a conical rod made of quartz, dense flint glass or optical glass which does not absorb the wavelength of the LD-light, a side of which is polished to a mirror-smooth state so as to allow total reflection even without cladding. Alternatively, the total reflection rod 6-1 may be one prepared by depositing a metal such as aluminum or gold on a side of optical glass or the like.

Here, both end faces of the total reflection rod 6-1 have coats 61 which are anti-reflective to the wavelength of the LD-light, as illustrated in FIG. 1C.

In the case in which the total reflection rod 6-1 is made of dense flint glass and equipped with cladding, the rod 6-1 has NA=0.9, and can take in incident light in a field with an anticipated angle of 128°.

The LD-light once launched into the total reflection rod 6-1 is guided to the emission surface with an efficiency of approximately 100%, and the output light is emitted through the emission surface with a large angle of emission. Therefore, according to the present embodiment, the emission surface of the total reflection rod 6-1 is placed in contact with a laser medium 7-1. The total reflection rod 6-1 and the laser medium 7-1 are brought into optical contact with each other using an optical adhesive or by thermo-compression bonding.

The laser medium 7-1 is pumped by the LD-light incident upon the end face thereof and outputs oscillation light. An output mirror 8 is placed at the side of the laser medium 7-1 at which the total reflection rod 6-1 is not in contact therewith. Here, as illustrated in FIG. 1C, the laser medium 7-1 has a coat 71, at the side in contact with the total reflection rod 6-1, which totally reflects the oscillation wavelength, but is anti-reflective to the wavelength of the LD-light, and a coat 72 at the other side which is anti-reflective to the oscillation wavelength.

As described above, according to the present embodiment, the output from the coupling optics which focuses the LD-light is input to the tapered total reflection rod to further focus the spot, thereby allowing miniaturization and simplification of the configuration of the device which focuses the spot of the LD-light from the two-dimensional array-type LD to a diameter of 1 mm or less. In addition, the LD-light may be easily focused into the laser medium by bringing the emission surface of the total reflection rod into contact with the laser medium.

In addition, the simple configuration of the laser device and the great improvement in the laser oscillation efficiency allow the device to be downsized.

Further, since the use of a rod made of glass different from ordinary flexible optical fibers as the total reflection rod allows application of coats anti-reflective to the wavelength of the LD-light to both end faces thereof, the pumping loss may be lowered.

The LD-pumped solid-state laser device according to the second embodiment of the present invention will now be described with reference to FIGS. 2A and 2B.

Referring to FIGS. 2A and 2B, the emission surface of a tapered total reflection rod 6-2 is polished to a spherical state.

By bringing the ball-lens-equivalent curved surface with a small radius of curvature (e.g., a radius of 0.5 mm or less) which is formed on the emission surface of the total reflection rod 6-2 into contact with the laser medium 7-1, the size of the spot may be made smaller than the case where the planes according to the first embodiment described above are contacted with each other.

The LD-pumped solid-state laser device according to the third embodiment of the present invention will now be described with reference to FIGS. 3A and 3B.

Figures 3A, 3B:
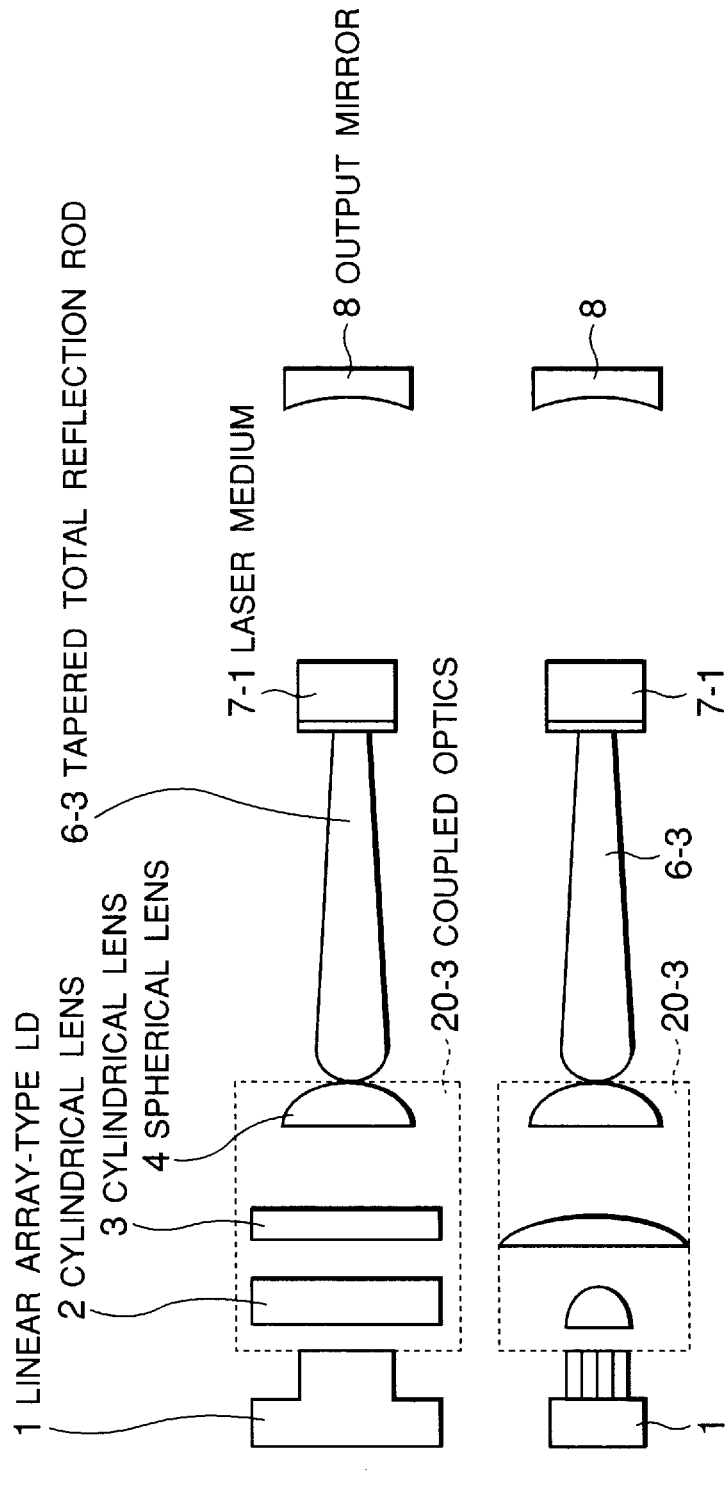
FIG. 3A is a side view illustrative of the configuration of the LD-pumped solid-state laser device according to a third embodiment of the present invention.
FIG. 3B is a plan view illustrative of the configuration of the LD-pumped solid-state laser device according to the third embodiment of the present invention.

Referring to FIGS. 3A and 3B, the incidence surface of a tapered total reflection rod 6-3 is polished to a spherical state.

Since the incidence surface of the total reflection rod 6-3 has a ball-lens-equivalent curved surface with a small radius of curvature (e.g., a radius of 1.5 mm or less), there is no need to provide the immediately preceding coupled optical system 20-3 with an aspherical lens. In addition, the coupling efficiency of the LD-light across the coupling optics 20-3 and the total reflection rod 6-3 may be increased.

Here, both the incidence and emission surface of the total reflection rod may be polished to the spherical state respectively by combining the second with the third embodiment of the present invention.

The LD-pumped solid-state laser device according to the fourth embodiment of the present invention will now be described with reference to FIGS. 4A, 4B and 4C.

According to the present embodiment, the incidence surface of a total reflection rod 6-4 is provided with a coat 61 which is anti-reflective to the wavelength of the LD-pumped light, while the emission surface of the total reflection rod 6-4 is provided with a dichroic coat 62 which has the characteristic of being anti-reflective to the wavelength of the LD-pumped light, but totally reflecting the oscillation wavelength of the laser medium. In addition, a dichroic coat 73 which is anti-reflective to the wavelength of the LD-pumped light and to the oscillation wavelength of a laser medium 7-2 as well is applied to the surface of the laser medium 7-2 at the side of the total reflection rod 6-4. Further, a dichroic coat 74 which has the characteristic of totally reflecting the wavelength of the LD-pumped light, but being anti-reflective to the oscillation wavelength of the laser medium 7-2, is applied to the surface of the laser medium 7-2 at the side of the output mirror.

According to the present embodiment, since coats which are anti-reflective to the wavelength of the oscillation laser light are applied to both end faces of the laser medium, and a coat which serves as a total reflection mirror of a laser resonator is applied to the emission surface of the tapered total reflection rod placed in contact with the laser medium. Therefore, the laser oscillation light is prevented from being instable due to possible deformation of the end faces of the laser medium which is caused by generation of absorption heat when the laser medium is end pumped in a high pumping light density.

The LD-pumped solid-state laser device according to the fifth embodiment of the present invention will now be described with reference to FIGS. 5A and 5B.

Figures 5A, 5B:
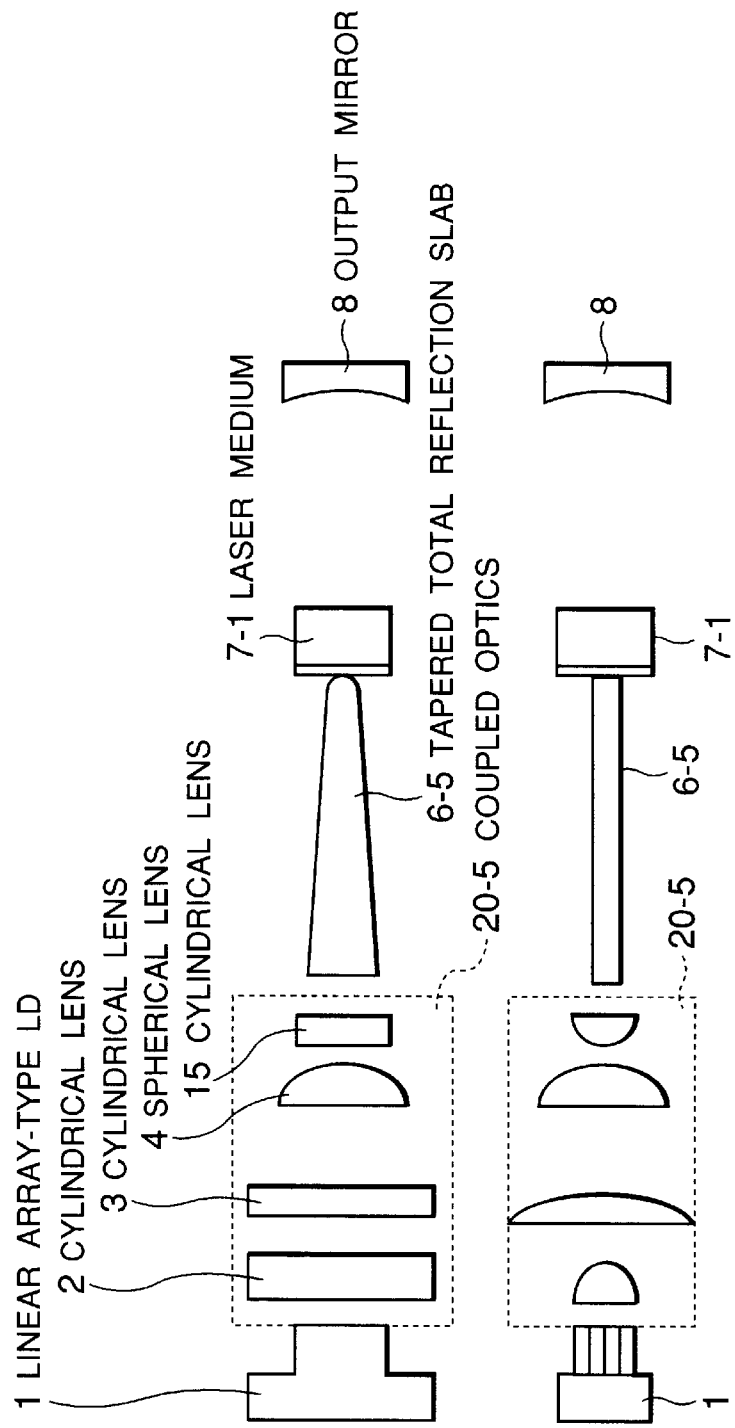
FIG. 5A is a side view illustrative of the configuration of the LD-pumped solid-state laser device according to a fifth embodiment of the present invention.
FIG. 5B is a plan view illustrative of the configuration of the LD-pumped solid-state laser device according to the fifth embodiment of the present invention.

Referring to FIGS. 5A and 5B, according to the present embodiment, a tapered total reflection slab 6-5 is provided as the optical medium which guides the output from the coupling optics to the laser medium; instead of the tapered total reflection rod used according to the first embodiment. In addition, a cylindrical lens 15 is provided in a coupled optical system 20-5 instead of the aspherical lens. The same effect may be produced even when a total reflection slab is used as the optical medium instead of the total reflection rod.

The LD-pumped solid-state laser device according to the sixth embodiment of the present invention will now be described with reference to FIG. 6.

Referring to FIG. 6, according to the present embodiment, a tapered, hollow waveguide 16 is provided instead of the tapered total reflection rod which is provided according to the first embodiment. The hollow waveguide 16 is formed of a copper pipe, and the inner surface thereof is polished and then plated with nickel and then gold.

Such use of a hollow waveguide made of a metal as the optical medium which guides the output from the coupling optics to the laser medium results in no coupling loss of the LD-pumped light at the incidence and emission surfaces thereof, thereby increasing the pumping power. In addition, the configuration according to the present invention easily allows cooling, if necessary.

The LD-pumped solid-state laser device according to the seventh embodiment of the present invention will now be described with reference to FIGS. 7A and 7B.

Figure 7A:
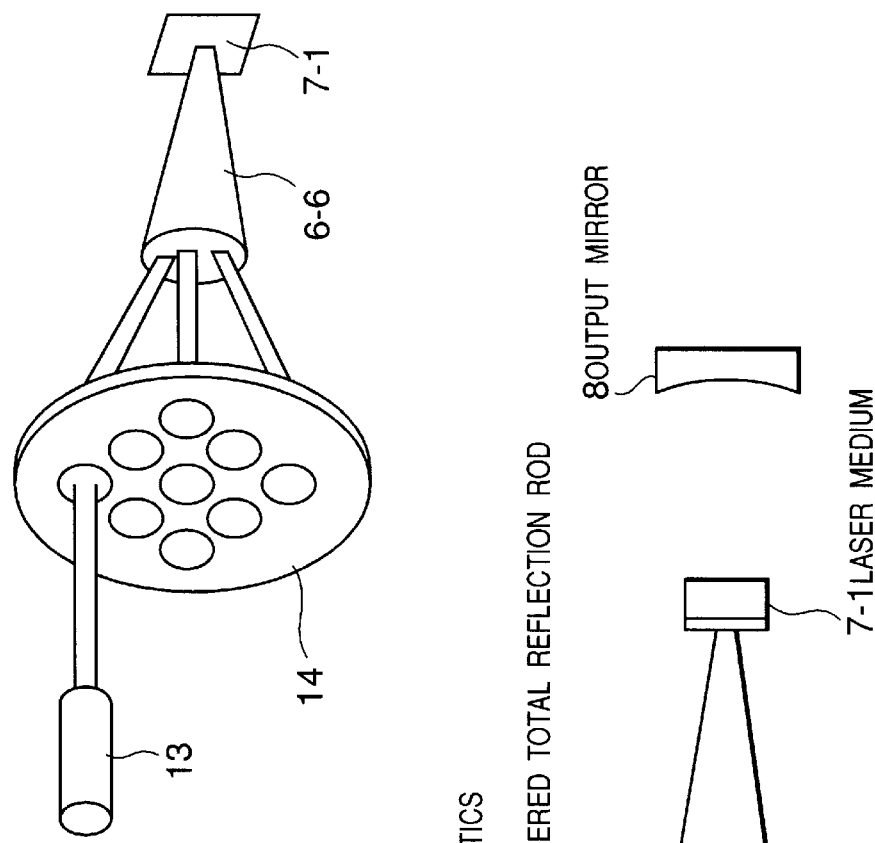
FIG. 7A is a perspective view illustrative of the configuration of the LD-pumped solid-state laser device according to a seventh embodiment of the present invention.
Figure 7B:
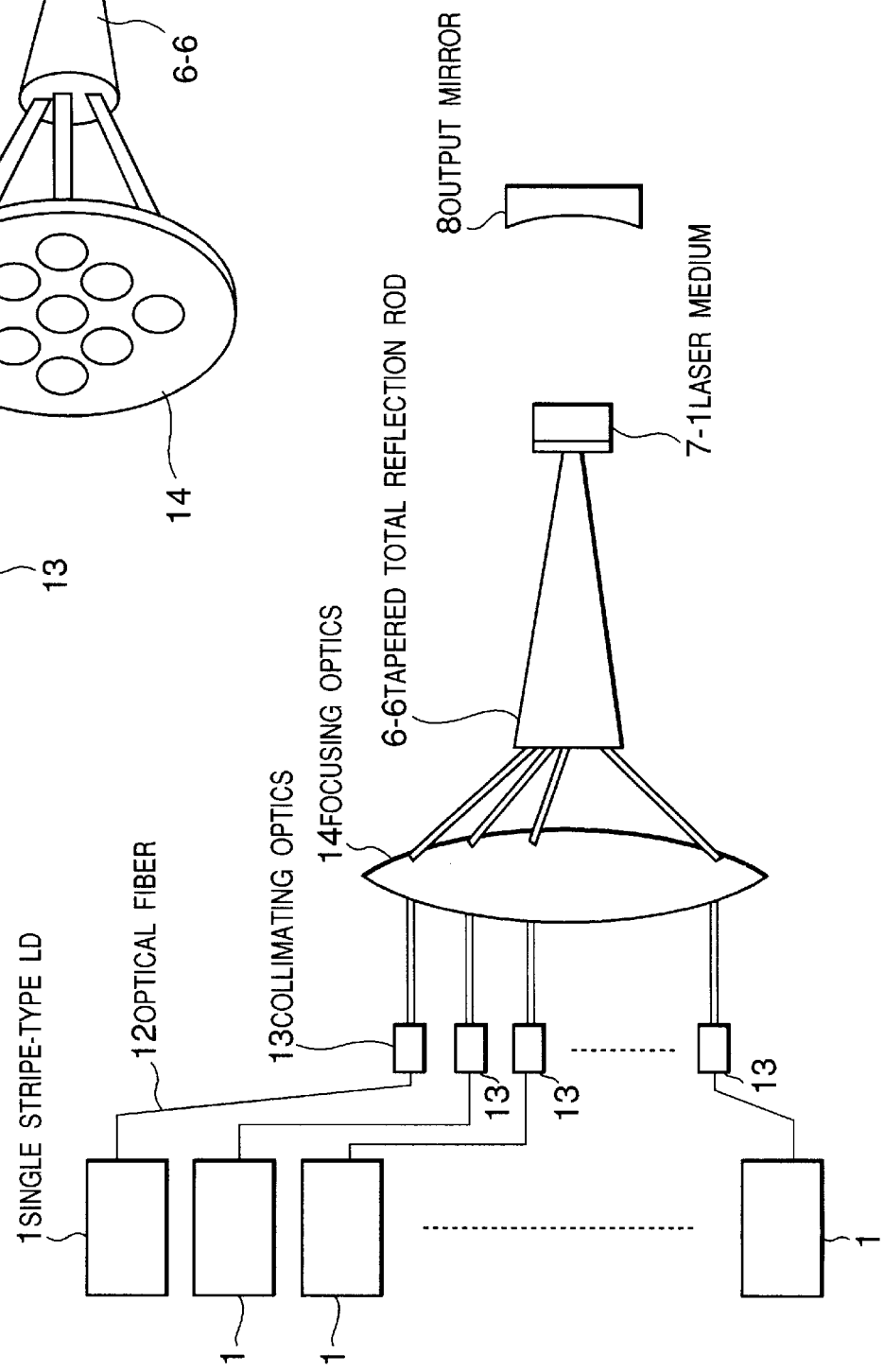
FIG. 7B is a side view illustrative of the configuration of the LD-pumped solid-state laser device according to the seventh embodiment of the present invention.

Referring to FIGS. 7A and 7B, outputs from a plurality of single stripe-type LDs 1—1 are guided to respective optical fibers 12. The beams of the LD-pumped light which have been output from the respective LDs 1—1 are focused through a focusing lens 14 (e.g., a convex lens) via a collimator lens 13 (e.g., a GRIN lens) provided at the front end of each of the optical fibers 12, and are launched into a tapered total reflection rod 6—6.

In this way, outputs from a plurality of pumping light sources may be bundled to obtain high-power oscillation laser light.

In addition, the use of the tapered total reflection rod as the optical medium for guiding the output from the coupling optics to the laser medium results in increased flexibility of the configuration of the coupling optics located just upward from the rod.

Therefore, outputs from a plurality of pumping light sources may easily be bundled in order to increase the output.

Here, according to the present embodiment, higher-powered pumping may be performed by using a recently developed linear array-type, fiber output-type LD.

The LD-pumped solid-state laser device according to the eighth embodiment of the present invention will now be described with reference to FIG. 8.

Figure 8:
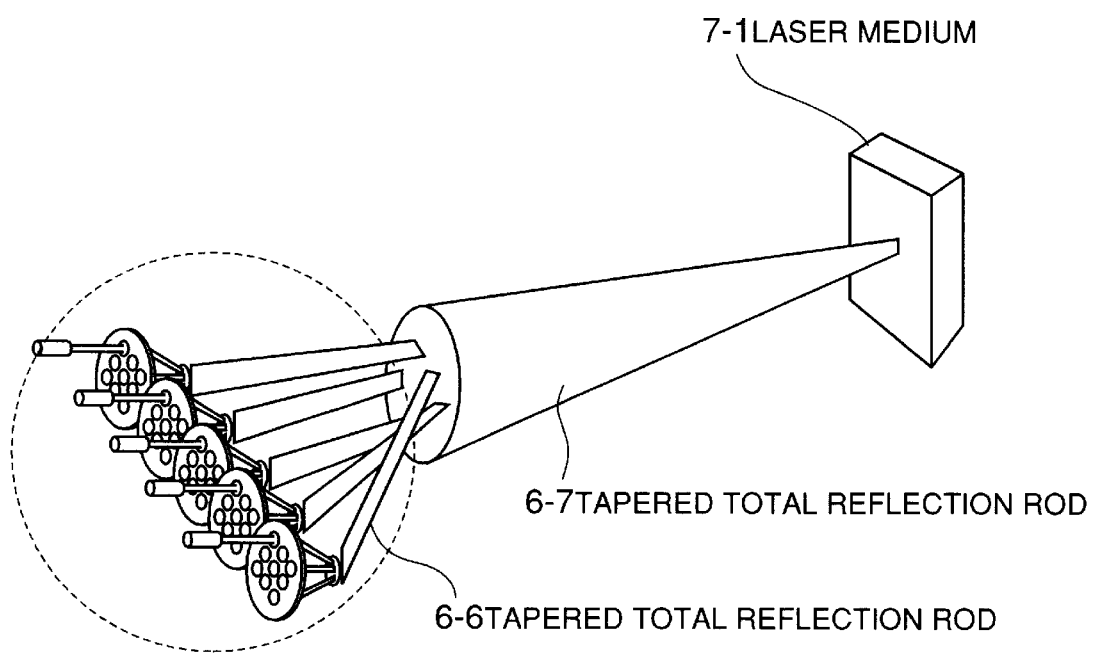
FIG. 8 is a perspective view illustrative of the configuration of the LD-pumped solid-state laser device according to an eighth embodiment of the present invention.

In FIG. 8, there are provided a plurality of tapered total reflection rods 6—6 as illustrated regarding the seventh embodiment described above. The output ends of the respective total reflection rods 6—6 are tied in a bundle or bundled, and then connected to a tapered total reflection rod 6-7 having a larger incidence aperture than the total reflection rods 6—6.

The present embodiment allows higher-powered pumping than the seventh embodiment.

Figure 9:
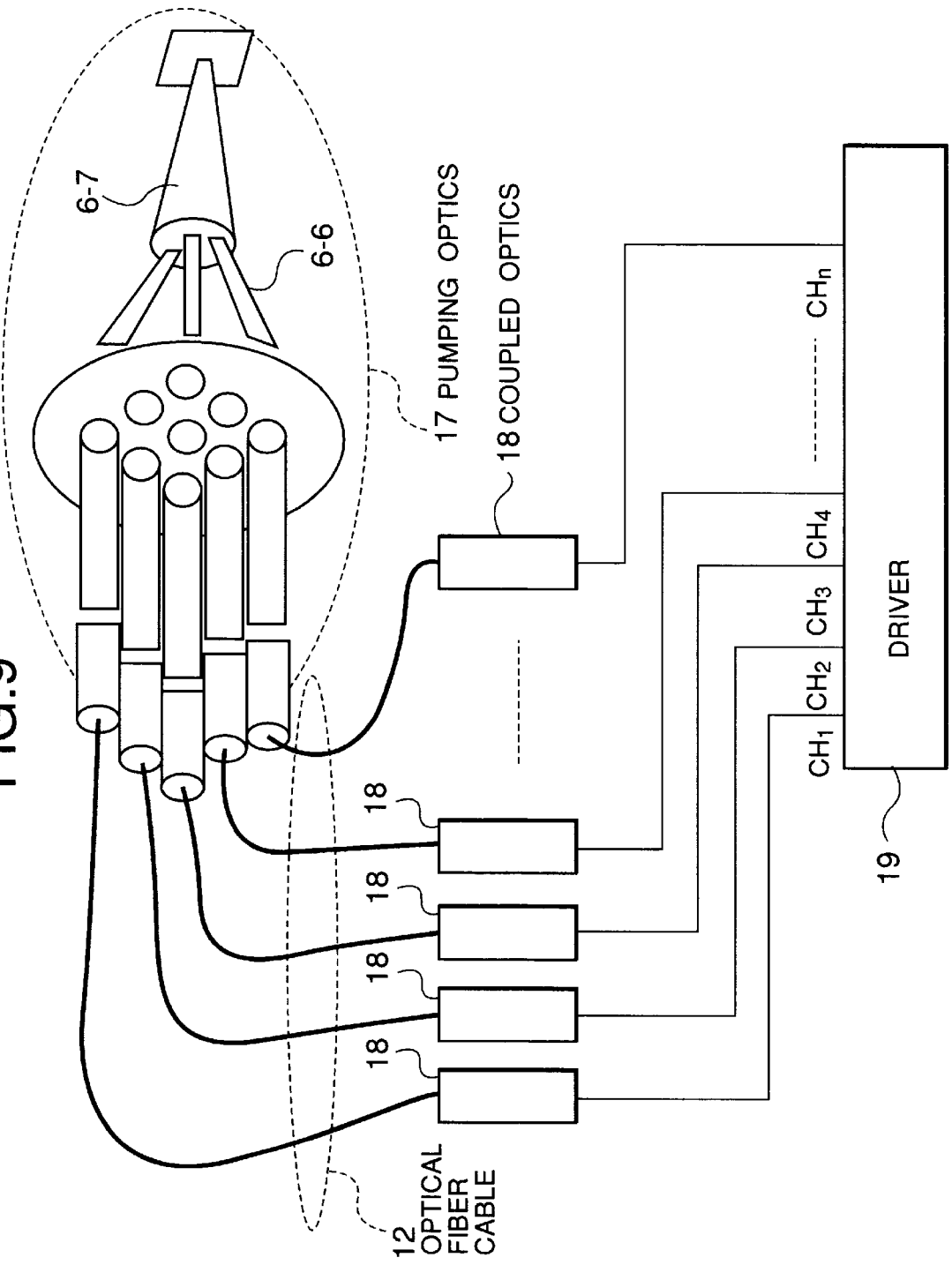
FIG. 9 is a schematic diagram illustrative of the configuration of the LD-pumped solid-state laser device according to a ninth embodiment of the present invention.
Figure 10:
FIG. 10 is a timing chart illustrative of the drive timing of the LD driver of the LD-pumped solid-state laser device according to the ninth embodiment of the present invention.

The LD-pumped solid-state laser device according to the ninth embodiment of the present invention will now be described with reference to FIG. 9 and FIG. 10.

The present embodiment relates to a laser device which oscillates pulses using quasi-continuous oscillation LDs. Referring to FIG. 9, an LD driver 19 drives the quasi-continuous oscillation LD provided for each of a plurality of coupled optical systems 18. The LD driver 19 drives the quasi-continuous oscillation LDs provided for the respective coupled optical systems 18, with predetermined phase shifts according to the timing illustrated in FIG. 10.

In cases where the maximum oscillation repetition frequency of the quasi-continuous oscillation LDs is A (Hz), the repetition frequency may be increased to "n" times by driving the respective quasi-continuous oscillation LDs at the same repetition frequency A (Hz) with cycles phase-shifted by 1/nA (s).

What is claimed is:

1. A laser device having means for pumping a laser medium with light which is output from a laser diode, comprising:
    a first lens for collimating the light which is output from said laser diode;
    a second lens for reducing the diameter of a spot of the light which has been collimated through said first lens;
    an optical medium to which light output from said second lens is input and has a smaller emission aperture than an incidence aperture; and
    a laser medium which is placed in contact with the emission aperture of said optical medium and is pumped by light which is output from said optical medium.

2. A laser device as claimed in claim 1, wherein said optical medium is a tapered rod.

3. A laser device as claimed in claim 2, wherein said tapered rod is formed by polishing a side of a conical optical member to a mirror-smooth state.

4. A laser device as claimed in claim 2, wherein said tapered rod is made of an inflexible member.

5. A laser device as claimed in claim 2, wherein said tapered rod has a spherical surface at the emission aperture thereof.

6. A laser device as claimed in claim 2, wherein said tapered rod has a spherical surface at the incidence aperture thereof.

7. A laser device as claimed in claim 1, wherein said optical medium is a tapered slab.

8. A laser device as claimed in claim 1, wherein said optical medium is a tapered hollow member, and the inner surface of said member is formed so as to totally reflect the light output from said laser diode.

9. A laser device as claimed in claim 8, wherein said hollow member is formed of a metallic material.

10. A laser device as claimed in claim 8, wherein said hollow member is formed of a copper pipe, and the inner surface of said pipe is plated with nickel and gold.

11. A laser device as claimed in claim 1, wherein said optical medium is in optical contact with said laser medium.

12. A laser device as claimed in claim 1, which further comprises:
    a first coat which is formed at the side of said laser medium at which said optical medium is in contact therewith, and has the characteristic of totally reflecting the oscillation wavelength of said laser medium and being anti-reflective to the wavelength of the light output from said laser diode;
    a second coat which is formed at the other side of said laser medium and is anti-reflective to said oscillation wavelength; and
    third coats which are formed at the incidence aperture and emission aperture of said optical medium and has the characteristic of being anti-reflective to the wavelength of the light output from said laser diode.

13. A laser device as claimed in claim 1, which further comprises:
    a coat which is formed at the incidence aperture of said optical medium and has the characteristic of being anti-reflective to the wavelength of the light output from said laser diode;
    a coat which is formed at the emission aperture of said optical medium and has the characteristic of being anti-reflective to the wavelength of the light output from said laser diode and totally reflecting the oscillation wavelength of said laser medium;
    a coat which is formed at the side of said laser medium at which said optical medium is in contact therewith and has the characteristic of being anti-reflective to the wavelength of the light output from said laser diode and said oscillation wavelength; and
    a coat which is formed at the other side of said laser medium and has the characteristic of totally reflecting the light output from said laser diode and being anti-reflective to said oscillation wavelength.

14. A laser device as claimed in claim 1, wherein said optical medium totally reflects the light output from said laser diode which passes said optical medium, into the inside of said optical medium in order to reduce the diameter of the spot of the light output from said laser diode.

15. A laser device as claimed in claim 1, wherein said optical medium is placed near said second lens so as to place the incidence aperture at such a location that said optical system focuses the light output from said laser diode to the greatest possible degree.

16. A laser device as claimed in claim 1, wherein said laser diode is a combination of quasi-continuous oscillation laser diodes with an "A" maximum oscillation repetition frequency, and said laser device further comprising:
    a driver for driving the respective quasi-continuous oscillation laser diodes at said maximum repetition frequency A with cycles which are shifted by a predetermined phase which is smaller than said repetition frequency A.

* * * * *